United States Patent
Rantala et al.

(10) Patent No.: US 8,133,965 B2
(45) Date of Patent: Mar. 13, 2012

(54) HIGH SILICON CONTENT SILOXANE POLYMERS FOR INTEGRATED CIRCUITS

(75) Inventors: Juha T. Rantala, Espoo (FI); Thomas Gädda, Espoo (FI); Jyri Paulasaari, Espoo (FI)

(73) Assignee: Silecs, Inc., Espoo (FI)

( * ) Notice: Subject to any disclaimer, the term of this patent is extended or adjusted under 35 U.S.C. 154(b) by 766 days.

(21) Appl. No.: 12/071,500

(22) Filed: Feb. 21, 2008

(65) Prior Publication Data
US 2008/0206578 A1 Aug. 28, 2008

Related U.S. Application Data

(60) Provisional application No. 60/902,494, filed on Feb. 22, 2007.

(51) Int. Cl.
*C08G 77/20* (2006.01)

(52) U.S. Cl. .......................................................... 528/32
(58) Field of Classification Search ...................... 528/32
See application file for complete search history.

(56) References Cited

U.S. PATENT DOCUMENTS

2005/0032357 A1* 2/2005 Rantala et al. ................ 438/637
* cited by examiner

*Primary Examiner* — Edward J Cain
(74) *Attorney, Agent, or Firm* — Kubovcik & Kubovcik

(57) ABSTRACT

Thin films are disclosed that are suitable as thin films in IC's and for other similar applications. In particular, the invention concerns thin films comprising compositions obtainable by hydrolysis of two or more silicon compounds, which yield an at least partially cross-linked siloxane structure. The invention also concerns a method for producing such films by preparing siloxane compositions by hydrolysis of suitable reactants, by applying the hydrolyzed compositions on a substrate in the form of a thin layer and by curing the layer to form a high silicon content film.

13 Claims, 3 Drawing Sheets es, layer etch, and photoresist and ARC removal on a substrate.
HIGH SILICON CONTENT SILOXANE POLYMERS FOR INTEGRATED CIRCUITS This application claims priority of U.S. Provisional Application for Patent Ser. No. 60/902,494 filed Feb. 22, 2007, which is incorporated herein by reference.

BACKGROUND OF THE INVENTION

1. Field of the Invention

The present invention relates to thin films suitable as dielectrics and other thin films in IC's and optoelectronic applications. In particular, the invention concerns thin films comprising compositions obtainable by hydrolysis of two or more silicon compounds, which yield an at least partially cross-linked siloxane structure. The invention also concerns a method for producing such films by preparing siloxane compositions by hydrolysis of suitable reactants and solvent, by applying the hydrolyzed compositions on a substrate in the form of a thin layer and by curing the layer to form a film with high silicon content.

2. Description of Related Art

Built on a semiconducting substrate, integrated circuits comprise of millions of transistors and other devices, which communicate electrically with one another and outside packaging material through multiple levels of vertical and horizontal wiring embedded in a dielectric material. Within the multilayer metallization structure, "vias" comprise the vertical wiring, whereas "interconnects" comprise the horizontal wiring. Fabricating the metallization can involve the successive depositing and patterning of multiple layers of dielectric and metal to achieve electrical connection among transistors and to outside packaging material. The patterning for a given layer is often performed by a multi-step process consisting of layer deposition, anti- reflection coating (ARC) spin, photoresist spin, photoresist exposure, photoresist development, layer etch, and photoresist and ARC removal on a substrate. Alternatively, the metal may sometimes be patterned by first etching patterns into a dielectric, filling the pattern with metal, then subsequently chemical mechanical polishing the metal so that the metal remains embedded only in the openings of the dielectric. As an interconnect material, aluminum has been utilized for many years due to its high conductivity (and low cost). Aluminum alloys have also been developed over the years to improve the melting point, diffusion, electromigration and other qualities as compared to pure aluminum. Spanning successive layers of aluminum, tungsten has traditionally served as the conductive via material. Silicon dioxide (dielectric constant of around 4.0) has been the dielectric of choice, used in conjunction with aluminum-based and tungsten-based interconnects and via for many years.

The drive to faster microprocessors and more powerful electronic devices in recent years has resulted in very high circuit densities and faster operating speeds, which in turn have required higher conductivity metals and lower-k dielectrics. In the past few years, VLSI (and ULSI) processes have been moving to copper damascene processes where copper (or copper alloys) is used for the higher conductance in the conductor lines and spin-on or CVD low-k dielectrics are used for the insulating material surrounding the conductor lines. To circumvent problems with etching, copper along with a barrier metal is blanket deposited over recessed dielectric structures consisting of interconnect and via openings and subsequently polished in a processing method known as "dual damascene." The bottom of the via opening is usually the top of an interconnect from the previous metal layer or in some instances, the contacting layer to the substrate.

In addition to the dielectric IC material being photopatternable or photocurable, it is also desirable that the material be easy to deposit or form, preferably at a high deposition rate and at a relatively low temperature. Once deposited or formed, it is desirable that the material be easily patterned, and preferably patterned with small feature sizes if needed. Once patterned, the material should preferably have low surface and/or sidewall roughness. It might also desirable that such materials be hydrophobic to limit uptake of moisture (or other fluids), and be stable with a relatively high glass transition temperature (not degrade or otherwise physically and/or chemically change upon further processing or when in use).

Also to meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

It has long been recognized that linewidth variations in patterns produced by photolithography can result from optical interference from light reflecting off an underlying layer on a semiconductor wafer. Variations in photoresist thickness due to the topography of the underlying layer also induce linewidth variations. Anti-reflective coatings (ARC) applied under a photoresist layer have been used to prevent interference from reflection of the irradiating beam. In addition, anti-reflective coatings partially planarize the wafer topography, helping to improve linewidth variation over steps because the photoresist thickness is more uniform.

Organic polymer films, particularly those that absorb at the i-line (365 nm) and g-line (436 nm) wavelengths conventionally used to expose photoresists, and at the recently used 248 nm and 193 nm wavelength, have been employed as anti-reflective coatings. However, the fact that the organic ARC's share many chemical properties with the organic photoresists can limit usable process sequences. Furthermore organic ARC's may intermix with photoresist layers. Silicon oxynitride is another material that has been used as an anti-reflective coating. However, silicon oxynitride works as an ARC by a destructive interference process rather than by absorption, which means that very tight control of the oxynitride thickness is necessary and that the material may not work well as an ARC over highly variable topography. Furthermore silicon oxynitride is typically deposited by chemical vapor deposition, while photoresist layers are typically applied using a spin-coater. The additional chemical vapor deposition process can add to processing complexity. Also silicon oxynitride is difficult remove from a device construction if needed.

A further class of materials that can be used as an anti-reflective layer-are silicon polymer compositions containing an absorption group.

Based on the art there is a need for organo siloxane polymer anti-reflective coating materials that absorb in the deep ultraviolet spectral region. It would be desirable for the ARC layer to be impervious to photoresist developers. There is also a need for a method to incorporate relative high silicon content with such siloxane polymer in order to increase etch selectivity of ARC. When polymer has relative high silicon the polymer can be also utilized as hard mask in the lithographic process due its high etch rate selectivity compared to other layers in the IC stack such as metal, carbon rich layers and photo resists. Still one critical requirement for such kind of silicon polymer is its stability in liquid form and particularly its stability in room temperature as it determines its utility in industrial processing.

To achieve such high silicon content polymer being compatible as ARC layer, hard mask layer or combination of both with good room temperature stability following siloxane polymers were synthesized.

SUMMARY OF THE INVENTION

It is an aim of the present invention to provide a method of producing a stable poly(organosiloxane) composition.

The invention also concerns thin films comprising compositions obtainable by hydrolysis of two or more silicon compounds, which yield an at least partially cross-linked siloxane structure, and the invention also concerns a method for producing such films by preparing siloxane compositions by hydrolysis of suitable reactants, by applying the hydrolyzed compositions on a substrate in the form of a thin layer and by curing the layer to form a high silicon content film.

The present invention is based on the idea of producing an organosiloxane polymer by hydrolyzing the corresponding monomers and subjecting them to conditions conducive to polymerization and by formulating the poly(organosiloxane) into a stable composition in a stabilizing organic solvent system. The step of formulating the siloxane polymer material into a stable composition in a stabilizing organic solvent system can comprise recovering the siloxane polymer in its reaction medium, i.e. in the solvent system forming the reaction medium, or recovering, and optionally isolating, the polymer which is then suspended in another solvent system.

The stable composition according to the present invention, comprises a organosiloxane polymer suspended and preferably dissolved in a stabilizing organic solvent system to give a composition having a solids content of more than 1 weight-%, said solvent system typically comprising an organic ether or a similar solvent capable of stabilizing the polymer so as to provide a shelf-life of at least 1 week, preferably at least 2 weeks, in particular at least 4 weeks, advantageous at least 6 weeks The present compositions can be used for making thin films.

Considerable advantages are obtained by the present invention. Thus, by using stabilizing solvent systems, the poly(organosiloxane) composition can be efficiently stabilized against ageing. As the below examples will show, in some preferred embodiments, stabilization will maintain the molecular mass of the composition stable, i.e. unchanged over extended periods of time: generally—at room temperature (about 25° C.) the molecular weight (weight average) will not increase more than about maximally 20% over a storage time of at least 45 days, in particular the molecular weight will not increase more than about 10%, at the most, over a period of at least 45 days. Maximally the molecular weight will not increase with more than 75% over a storage time of at least 60 days at room temperature, in particular the molecular weight will not increase with more than 30% or even 25% or less at room temperature and a storage time of 60 days. For storage at higher temperature. (40° C.), the maximal increase of molecular weight is about 200%, preferably 125%, in particular 100%, after 45 days, and 400% or less, preferably 300% or less, in particular 150% or less, after 60 days. Next the invention will be examined more closely with the aid of a detailed description and with reference to the appended drawings.

DETAILED DESCRIPTION OF PREFERRED EMBODIMENTS

Figure 1:
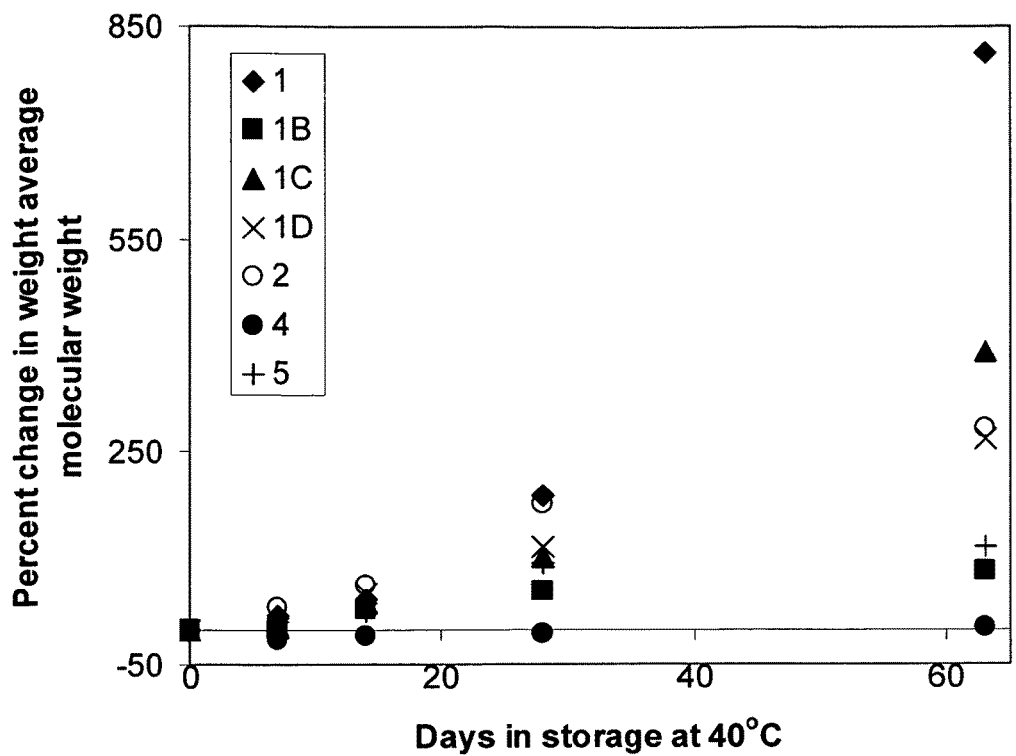
FIG. 1 shows the change (in percents) of the weight average molecular weight of a number of poly(organosiloxane) compositions as a function of storage time.
Figure 2:
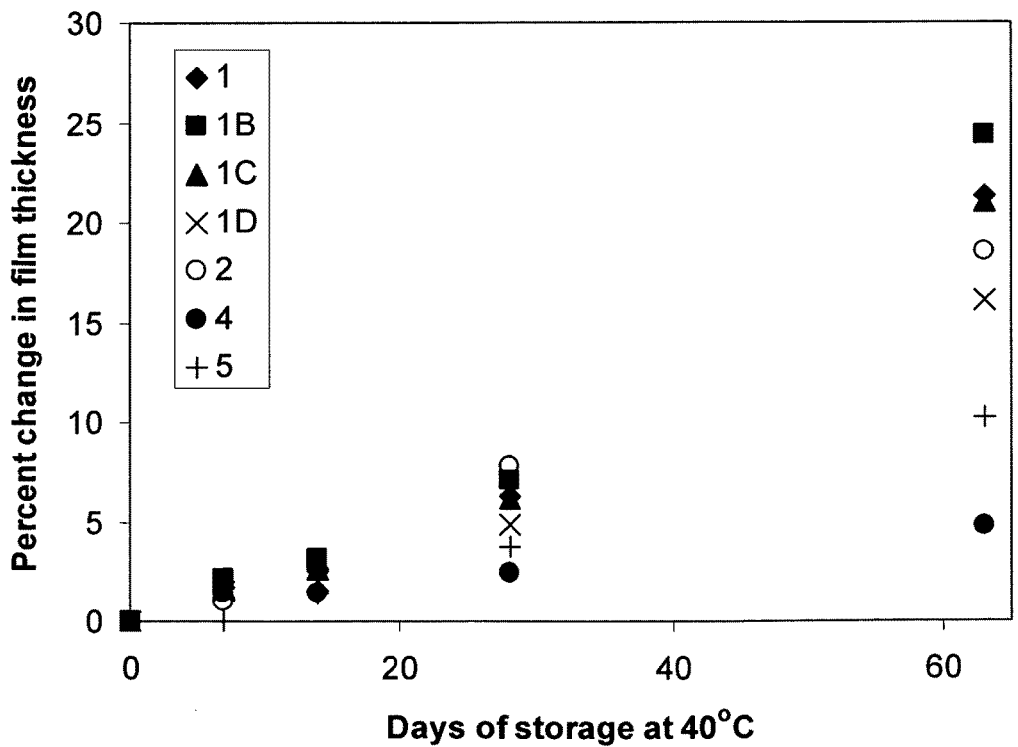
FIG. 2 shows the change in the film thickness (in percents) obtained from similar polymer solutions as a function of storage time.
Figure 3:
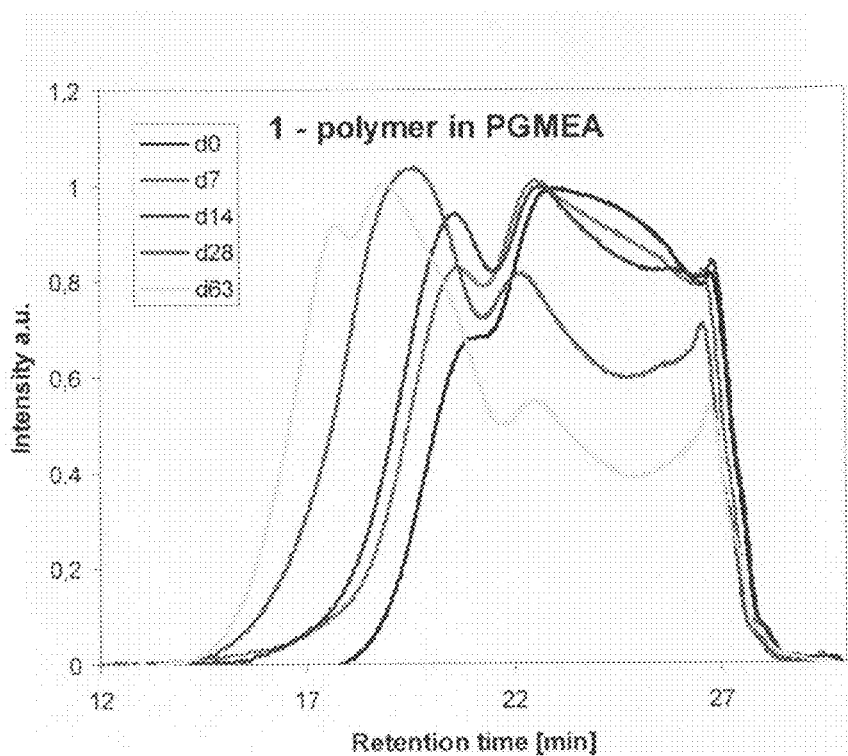
FIG. 3 shows the change in the size exclusion chromatography profile for a polymer solution in PGMEA (1) as a function of storage time.
Figure 4:
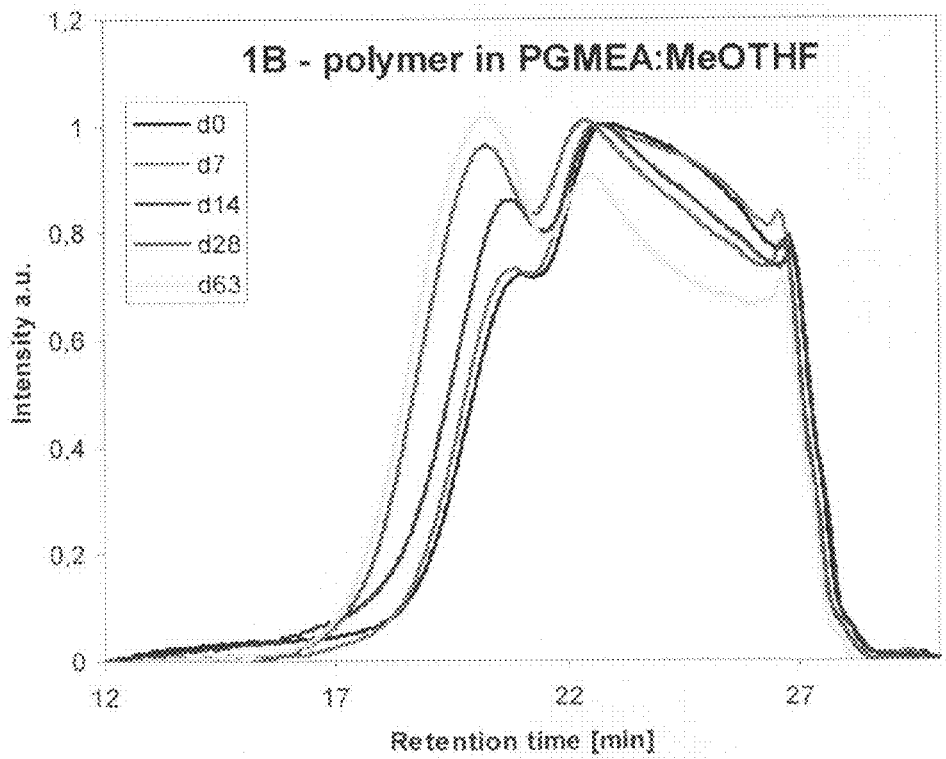
FIG. 4 shows the change in the size exclusion chromatography profile for a polymer solution as a function of storage time.
Figure 5:
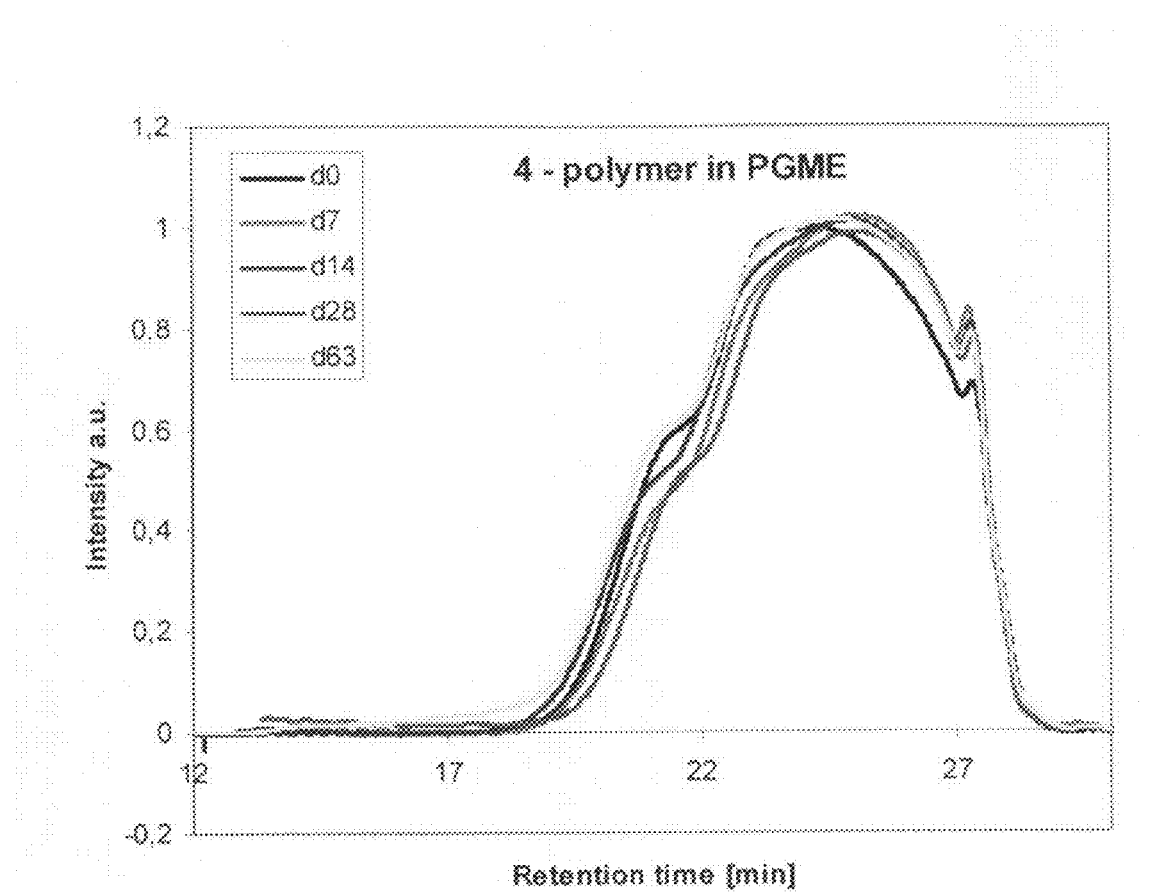
FIG. 5 shows the change in the size exclusion chromatography profile for a polymer solution as a function of storage time

As mentioned above, organosiloxane polymers prepared from alkoxysilanes by hydrolysis inherently will have residual functional groups that may undergo further reactions, i.e. cause aging of the material. Typical functional groups of this kind are silanol groups (Si—OH groups). The reactions of the residual functional groups will result in an increase in molecular weight that may be undesirable as this change in material properties may significantly alter the performance when used in the described applications.

We have found that by polymerizing/hydrolyzing siloxane monomers in an organic ether or by using an organic ether as a co-solvent for the organosiloxane polymers, it is possible greatly to increase stability of said polymers in solution.

The method according to the present invention comprises the step of producing a partially cross-linked organosiloxane polymer in a stabilizing organic solvent system, said polymer having a molecular weight of about 1,000 to 10,000 g/mol, in particular about 3,000 to 7,500 g/mol, e.g. about 4,000 to 6,000 g/mol, measured against a polystyrene standard.

The partially cross-linked organosiloxane polymer exhibits at least some silanol groups. Typically, the partially cross-linked organosiloxane polymer exhibits at least 1 silanol group per 100 groups, in particular 1 silanol group per 10 groups, having the formula Si—OR$^{HC}$, wherein RHC stands for a hydrocarbyl residue. The hydrocarbyl residue is, for example, the residue of one of the hydrocarbon substituents Rn below mentioned, wherein n is an integer 1 to 9.

The stabilizing organic solvent system is formed by an organic ether optionally in mixture with other co-solvent or co-solvents. The organic ether is a linear or cyclic ether comprising generally 4 to 26 carbon atoms and optionally other functional groups, such as hydroxyl groups. Particularly suitable examples are five and six membered cyclic ethers, which optionally bear substituents on the ring, and ethers, such as $(C_{1-20})$alkanediol $(C_{1-6})$alkyl ethers. Examples of said alkanediol alkyl ethers are propylene glycol monomethyl ether, propylene glycol dimethyl ether, propylene glycol n-butyl ether, dipropylene glycol monomethyl ether, dipropylene glycol. dimethyl ether, dipropyleneglycol n-butyl ether, tripropylene glycol monomethyl ether and mixtures thereof. Particularly preferred examples of the present ethers are methyl tetrahydrofurfuryl ether, tetrahydrofurfuryl alcohol, propylene glycol n-propyl ether, dipropylene glycol dimethyl ether, propylene glycol n-methyl ether, and mixtures thereof. The stabilizing solvent system consists of a solvent comprising of the ether of this kind alone, or of a mixture-of such ether with a typical reaction medium of the hydrolyzation or other solvents such as propylene glycol monomethyl ether acetate. The proportion of the ether is, in such a case, about 10 to 90 wt-%, in particular about 20 to 80 wt-% of the total amount of the solvent.

According to one embodiment, the hydrolyzation of the organosilane monomers is carried out in an organic ether, which is then used for storage of the film-making composition and optionally for the actual for film formation step.

In a second embodiment, polymerization is carried out completely without solvents, or it is carried out in other solvents than the ethers listed above, such as in alcohols, esters, ketones and ethers such as acetone, ethyl methyl ketone, methanol, ethanol, isopropanol, butanol, methyl acetate, ethyl acetate, propyl acetate, butyl acetate and tetrahydrofuran. By means of this embodiment, wherein polymerization is carried out in one solvent, which is then after polymerization changed for a stabilizing solvent the stability of the solution can be increased with a stabilizing ether, while still preserving proper cross-linking properties of the polymer (faster curing or curing at lower temperature).

Typically, the composition exhibits a solids content of about 5 to 30 weight-%, in particular about 10 to 25 weight-%.

The thin films disclosed are suitable as thin films in IC's and for other similar applications.

According to a preferred embodiment, a composition suitable for the production of a thin film is formed by hydrolyzing a first monomeric silicon compound having at least three hydrolysable groups attached to the silicon with a second monomeric silicon compound having at least one hydrocarbyl radical, containing an unsaturated carbon-to-carbon bond or epoxy group, and at least one hydrolyzable group attached to the silicon atom of the compound, and optionally with a third monomeric silicon compound having at least one aryl group and at least one hydrolyzable group attached to the silicon atom of the compound to form a siloxane material, and formulating the siloxane material into a stable comiposition in a stabilizing organic solvent system as discussed above.

The present invention is particularly well suited for the production of compositions comprises a poly(organosiloxane) obtained by hydrolyzing a first silicon compound having the general formula I $$X^1{}_{3-a}\text{—}SiR^1{}_bR^2{}_cR^3{}_d \qquad I$$

wherein $X^1$ represents a hydrolyzable group;

$R^1$ is an alkenyl, alkynyl or epoxy group, which optionally bears one or more substituents;

$R^2$ and $R^3$ are independently selected from hydrogen, substituted or non-substituted alkyl groups, substituted or non-substituted alkenyl and alkynyl groups, and substituted or non-substituted aryl groups;

a is an integer 0, 1 or 2;
b is an integer a+1;
c is an integer 0, 1 or 2;
d is an integer 0 or 1; and
b+c+d=3 hydrolyzing a first silicon compound having the general formula II $$X^1{}_{3-a}\text{—}SiR^1{}_bR^2{}_cR^3{}_d \qquad I$$

wherein $X^1$ represents a hydrolyzable group;

$R^1$ is an alkenyl, alkynyl or epoxy group, which optionally bears one or more substituents;

$R^2$ and $R^3$ are independently selected from hydrogen, substituted or non-substituted alkyl groups, substituted or non-substituted alkenyl and alkynyl groups, and substituted or non-substituted aryl groups;

a is an integer 0, 1 or 2;
b is an integer a+1;
c is an integer 0, 1 or 2;
d is an integer 0 or 1; and
b+c+d=3 with a second silicon compound having the general formula II $$X^2{}_{3-e}\text{—}SiR^4{}_fR^5{}_gR^6{}_h \qquad II$$

wherein $X^2$ represents a hydrolyzable group;

$R^4$ is an aryl group, which optionally bears one or more substituents;

$R^5$ and $R^6$ are independently selected from hydrogen, substituted or non-substituted alkyl groups, substituted or non-substituted alkenyl and alkynyl groups, and substituted or non-substituted aryl groups;

e is an integer 0, 1 or 2;
f is an integer e+1;
g is an integer 0, 1 or 2;
h is an integer 0 or 1; and
f+g+h=3.

From such compositions, thin films having excellent properties in IC's and in can be produced.

According to one preferred embodiment, the thin film is produced from a composition obtained by hydrolyzing the first and the second silicon compounds with a third silicon compound having the general formula III $$X^3{}_{3-i}\text{—}SiR^7{}_jR^8{}_kR^9{}_l \qquad II$$

wherein $X^3$ represents a hydrolyzable group;

$R^7$ is an alkyl group, which optionally bears one or more substituents;

$R^8$ and $R^9$ are independently selected from hydrogen, substituted or non-substituted alkyl groups, substituted or non-substituted alkenyl or alkynyl groups, and substituted or non-substituted aryl groups;

i is an integer 0, 1 or 2;
j is an integer i+1;
k is an integer 0, 1 or 2;
l is an integer 0 or 1; and
j+k+l=3.

The molar ratios of the monomeric compounds (first silicon monomer to second silicon monomer) is generally about 1:1000 to 1000:1; in particular 1:100 to 100:1, preferably about 10:1 to 1:10, and the molar ratio of the third silicon monomer to the sum of the first and the second monomers is about 1:1000 to 10:1.

In the composition, the hydrolysable groups $X^1$, $X^2$ and $X^3$ can independently be selected from hydroxyl, alkoxy, acyloxy and halogen.

The hydrolysable groups $X^1$, $X^2$ and $X^3$ are different or identical.

In the meaning of "halogen", each of the hydrolysable groups $X^1$, $X^2$ and $X^3$ preferably and independently stands for chlorine or bromine.

The alkenyl in the meaning of substituents $R^1$ to $R^3$, $R^5$, $R^6$, $R^8$ and $R^9$ preferably stands for a linear or branched alkenyl group containing 2 to 18, preferably 2 to 14, and in particular 2 to 12 carbon atoms, the ethylenic double bond being located located at the position 2 or higher, the branched alkenyl containing a C1 to C6 alkyl, alkenyl or alkynyl group, which optionally is per-fluorinated or partially fluorinated, at alpha or beta positions of the hydrocarbon chain.

In particular, the alkenyl group is vinyl or allyl.

The aryl in the meaning of substituents $R^2$ to $R^6$, $R^8$ and $R^9$ preferably stands for a mono-, bi-, or multicyclic aromatic carbocyclic group, which optionally is substituted with $C_1$ to $C_6$ alkyl groups or halogens.

When the aryl group is phenyl it optionally bears 1 to 5 substituents selected from halogen, alkyl or alkenyl on the ring, when it is naphthyl it optionally bears 1 to 11 substituents selected from halogen alkyl or alkenyl on the ring structure. The substituents being optionally fluorinated.

"Alkyl" in the meaning of substituents $R^2$, $R^3$, $R^5$ to $R^9$ stands for a linear or branched alkyl group containing 1 to 18, preferably 1 to 14, and in particular 1 to 12 carbon atoms, the branched alkyl containing a $C_1$ to $C_6$ alkyl, alkenyl or alkynyl group, which optionally is per-fluorinated, at alpha or beta positions of the hydrocarbon chain, to mentioned preferred embodiments.

In particular, when the alkyl group is a lower alkyl it contains 1 to 6 carbon atoms, which optionally bear 1 to 3 substituents selected from methyl and halogen.

A particularly interesting thin film is based on a material obtained by hydrolyzing a trichlorosilane having a vinyl group attached to the silicon atom, with a trichlorosilane having a phenyl or naphthyl group attached to the silicon atom.

Another interesting thin film is based on a material obtained by hydrolyzing a trichlorosilane having a vinyl group attached to the silicon atom, with a trichlorosilane having a phenyl or naphthyl group attached to the silicon atom and with a trichlorosilane having a lower alkyl group attached to the silicon atom.

In the thin film the silicon content is typically about 30 to 43 weight %, in particular about 37 to 43 weight %

The following abbreviations are used in the examples:
PGMEA: propylene glycol n-methyl ether acetate,
MeOTHF: methyltetrahydrofurfuryl ether,
PNP: propylene glycol n-propyl ether,
DPGDME: dipropylene glycol dimethyl ether,
PGME: propylene glycol n-methyl ether, and
ETACAC ethyl acetyl acetonate.

The solvents are either VLSI or SLSI grade, or they have been distilled before use.

EXAMPLE 1

Vinyltrimethoxysilane (14.72 g, 99 mmol), phenyltrimethoxysilane (39.40 g, 199 mmol), methyl triethoxysilane (35.42 g, 199 mmol) and tetraethoxysilane (310.44 g, 1490 mmol) were dissolved in acetone (800 g). Dilute hydrochloric acid (0.01 M, 134.28 g, 7454 mmol) was added in, and the system was stirred for 30 minutes. The flask was then refluxed for five hours. It was subsequently taken to a rotary evaporator and evaporated at 150 mbar until no condensate was collected. Propylene glycol methyl ether acetate, PGMEA, (219.95 g) was added, and evaporation was continued at 45 mbar for one hour. After evaporation, solid content was adjusted to 25% with PGMEA, and the molecular weight was adjusted by heating at 120° C. for two hours.

The polymer was formulated in four different solvent systems:
A: 11.6% PGMEA solution;
B: addition of methyl tetrahydrofurfuryl ether so that a 11.6% solution was obtained;
C: addition of propylene glycol propyl ether so that a 11.4% solution was obtained;
D: addition of dipropylene glycol dimethyl ether so that a 12.5% solution was obtained; and
C-1E: addition of ethyl acetyl acetonate so that a 12.5% solution was obtained.

EXAMPLE 2

Vinyltrimethoxysilane (14.72 g, 99 mmol), phenyltrimethoxysilane (39.40 g, 199 mmol), methyl triethoxysilane (106.26 g, 597 mmol) and tetraethoxysilane (227.66 g, 1093 mmol) were dissolved in acetone (776 g). Dilute hydrochloric acid (0.01 M, 127.13 g, 7057 mmol) was added in, and the system was stirred for 30 minutes. The flask was then refluxed for five hours. It was then taken to rotary evaporator and evaporated at 150 mbar until no condensate was collected. PGMEA (219.95 g) was added, and evaporation was continued at 45 mbar for one hour. After evaporation, solid content was adjusted to 25% with PGMEA, and molecular weight was adjusted by heating at 120° C. for two hours.

EXAMPLE 3

1,5-(o-phenylene)-2,2-diethoxy-1-oxa-2-silapentane was prepared by the reaction of 2-allyl phenol with triethoxysilane, followed by cyclization by hydrosilylation with Karsted platinum.

1,5-(o-phenylene)-2,2-diethoxy-1-oxa-2-silapentane (8.06 g, 149 mmol), phenyltrimethoxysilane (6.33 g, 298 mmol) and tetraethoxysilane (75.42 g, 2235 mmol) were dissolved in acetone (179.63 g), and dilute hydrochloric acid (0.01 M, 29.54 g, 1640 mmol) was added. The solution was stirred for 28 minutes at RT, followed by refluxing for five hours. It was then taken to rotary evaporator and evaporated at 150 mbar until no condensate was collected. PGME (219.95 g) was added, and evaporation was continued at 45 mbar for one hour. After evaporation, solid content was adjusted to 25% with PGMEA, and the material was further reacted by heating at 120° C. for two hours.

EXAMPLE 4

Vinyltrimethoxysilane (14.71 g, 99 mmol), phenyltrimethoxysilane (39.40 g, 199 mmol), methyl triethoxysilane (35.42 g, 199 mmol) and tetraethoxysilane (310.44 g, 1490 mmol) were dissolved in acetone (800 g). Dilute hydrochloric acid (0.01 M, 134.28 g, 7454 mmol) was added in, and the system was stirred for 30 minutes. The flask was then refluxed for five hours. It was then taken to rotary evaporator and evaporated at 150 mbar until no condensate was collected. PGME (219.90 g) was added, and evaporation was continued at 55 mbar for one hour. After evaporation, the solids content was adjusted to 25% with PGME, and molecular weight was adjusted by heating at 120° C. for two hours. The final product was dissolved in PGME to obtain a 8.3% solution.

EXAMPLE 5

A polymer was prepared as described in Example 4 with the exception that PNP was used instead of PGME. After molecular weight adjustment, the final product was diluted with PNP to give a 10.5% polymer solution.

Stability of the Polymers

The materials prepared as described in the examples given herein were subjected to storage stability tests. In addition, certain compositions in an aging study were subjected to further purification to remove fortuitous catalyst residues. Furthermore, the effect of co-solvents was examined to evaluate their effect to the aging effect. The following solvents were used as co-solvents to evaluate their effect on the aging performance of a polymer prepared as described in Example 1:

methyltetrahydrofurfuryl ether (Me OTHF, 1B),
propylene glycol n-propyl ether (PNP, 1C),
dipropylene glycol dimethyl ether (DPGDME, 1D), and
propylene glycol n-methyl ether (PGME) and ethyl acetyl acetonate (ETACAC, comparative example C-1E).

Furthermore, PGME (4) and PNP (5) were used in the synthesis to completely replace PGMEA.

As the polymer ages, i.e. increases in molecular weight when stored in solution, some properties will change. Such are the viscosity of the polymer solution and the resultant film thickness when coated on a surface in a similar manner. Properties that do not have been found to change is the refractive index of both the polymer solution and the resultant film, the shrinkage of the film during cure as well as the color of the polymer solution.

Preparation of Flasks Used to Store Polymer Solutions:

125 ml Nalgene® bottles were rinsed three times with SLSI grade isopropanol to remove any residual organic compounds from the surfaces of the bottles. The bottles were filled with dilute $HNO_3$ and allowed to sit for at least 12 hours. The bottles were then rinsed thoroughly with ultra pure water, SLSI grade isopropanol, SLSI grade acetone and dried. The polymer solutions were directly filtered through 0,2 μm PALL Acrodisc filters into the cleaned flasks.

Purification of Polymer Solution:

A 1000 ml round-bottom (rb) flask was rinsed 2 times with 2-propanol, filled with ultrapure water and allowed to sit for 1 hour. The flask was then emptied, rinsed with 2-propanol and acetone, respectively, and dried. A Teflon covered magnetic stir bar and a polymer solution concentrate described in Example 1 (100.23 g, solid content=24.96%) was placed in the cleaned rb-flask. The polymer was then diluted with a two-fold amount of methyl tert-butyl ether (MTBE, 200 g). Water (40 g) was added and the solution was stirred (300-400 rpm) for 10 minutes. The two phases were allowed to separate and the aqueous layer was removed using a plastic pipette, which had been thoroughly rinsed with acetone. The washing step was repeated twice with 25 g water. In each case, the solution was stirred (1200 rpm) for 5 minutes. Both the aqueous and the organic layers were cloudy after phase separation. MTBE (50 ml) was added to further improve the phase separation during the second wash cycle. Then, 99.97 g PGMEA was added to the organic phase, which became clear as a result of the addition. After this, MTBE was removed under reduced pressure using a rotary evaporator. Bath temperature was 50° C., while pressure was maintained between 270-330 mbar. Once MTBE was removed, the pressure was slowly reduced to 20 mbar, held there for 5 min, further lowered to 15 mbar and held at this pressure for an additional 5 min. In this way, 123.5 g (solid content 18.66%) of a clear, colorless solution was obtained. Yield 92%. GC analysis confirmed that PGMEA was the only volatile component of the solution.

Film Coating

The final polymer solutions were directly applied as coatings on 4" Si-wafers. The spin speed during dispense was 2500 rpm. The obtained coating was heated at 130° C. for 2 min and then at 250° C. for another 2 min. The resultant film thickness was measured.

TABLE 1

Storage stability of materials at room temperature (ambient) and 40° C. measured after 63 days.

| Material (number indicates example) | Molecular weight | | | Viscosity | | | Thickness of film | | |
|---|---|---|---|---|---|---|---|---|---|
| | Initial value [g/mol] | % increase at RT | % increase at 40° C. | Initial value [mPas] | % increase at RT | % increase at 40° C. | initial value [nm] | % increase at RT | % increase at 40° C. |
| 1 | 5497 | 42 | 812 | 1,997 | 7 | 33 | 200 | 0.8 | 21.3 |
| 2 | 9559 | 15 | 283 | 2,036 | 3 | 25 | 206 | 1.0 | 18.4 |
| 1 purified | 9490 | 63 | 2390 | 2,230 | 6 | 216 | 206 | 3.4 | 16.5 |
| 1 with $HNO_3$ catalyst | 82238 | 24 | — | 2,797 | 16 | 79 | 234 | 3.0 | 28.2 |
| 1B | 5539 | 3 | 83 | 1,837 | 5 | 24 | 208 | 1.2 | 24.3 |
| 1C | 5233 | 29 | 391 | 2,322 | 10 | 42 | 206 | 1.6 | 21.0 |
| 1D | 5778 | 24 | 267 | 2,097 | 7 | 27 | 206 | 1.0 | 16.1 |
| Comparative C1-E | 10546 | gelled | gelled | 3.107 | gelled | gelled | 200 | gelled | gelled |
| 4 | 4906 | −1 | 3 | 2,581 | −2 | −2 | 210 | 0.5 | 2.4 |
| 5 | 15908 | −11 | 115 | 3,276 | 3 | 7 | 215 | 0.0 | 10.0 |

The invention claimed is:

1. A method of producing a poly(organosiloxane) composition, comprising the steps of
hydrolyzing monomeric silicon compounds under conditions conducive to polymerization of the compounds to form a siloxane polymer material, and
producing a partially cross-linked organosiloxane polymer in a stabililing organic solvent System, said partially cross-linked organosiloxane polymer exhibiting at least 1 silanol group per 100 groups, having the formula Si—OR$^{HC}$, wherein R$^{HC}$ stands for hydrocarbyl residue, and having a moleculak weight of about 1,000 to 10,000 g/mol measured against a polystyrene standard.

2. The method according to claim 1, wherein the stabilizing organic solvent system is formed by an organic ether optionally in mixture with another solvent.

3. The method according to claim 2, wherein the organic ether is selected from the group of cyclic or linear organic ethers comprising 4 to 26 carbon atoms and mixtures thereof.

4. The method according to claim 3, wherein the organic ether is selected from cyclic ethers comprising a 5- or 6-membered ring.

5. The method according to claim 3, wherein the organic ether is selected from ($C_{1-20}$)alkanediol ($C_{1-6}$) alkyl ethers.

6. The method according to claim 1, wherein the stabilizing organic solvent system comprises at least one solvent selected from the group of methyltetrahydrofurfuryl ether, propylene glycol n-propyl ether, dipropylene glycol dimethyl ether, propylene glycol n-methyl ether, and mixtures thereof.

7. The method according to claim 3, wherein the organic ether is mixed with propylene glycol n-methyl ether acetate.

8. The method according to claim 1, wherein the composition exhibits a solids content of about 5 to 30 weight-%.

9. The method according to claim 1, wherein a composition suitable for the production of a thin film is formed by
hydrolyzing a first monomeric silicon compound having at least three hydrolysable groups attached to the silicon with
a second monomeric silicon compound having at least one hydrocarbyl radical, containing an unsaturated carbon-to-carbon bond or epoxy group, and at least one hydrolyzable group attached to the silicon atom Of the compound, and optionally with
a third monomeric silicon compound having at least one aryl group and at least one hydrolyzable group attached to the silicon atom of the compound to form a siloxane material, and
producing the partially cross-linked organosiloxane polymer in the stabilizing organic solvent system.

10. The method according to claim 1, wherein polymerization of the silicon monomers is carried out in the stabilizing organic solvent.

11. The method according to claim 1, wherein polymerization of the silicon monomers is carried out in a first solvent or without any solent, and the polymerized siloxane material is formulated into a siloxane composition in a second, stabilizing organic solvent.

12. The method according to claim 11, wherein polymerization is carried out in an alcohol, ester, ketone or ether, such as acetone, ethyl methyl ketone, methanol, ethanol, isopropanol, butanol, methyl acetate, ethyl acetate, propyl acetate, butyl acetate or tetrahydrofuran or a mixture thereof.

13. A composition produced by the method according to claim 1.

* * * * *